United States Patent [19]
Snyder et al.

[11] 4,081,746
[45] Mar. 28, 1978

[54] MULTIPLE RATE METER

[75] Inventors: Carl J. Snyder; Milton Blick, both of Raleigh, N.C.

[73] Assignee: Westinghouse Electric Corporation, Pittsburgh, Pa.

[21] Appl. No.: 629,266

[22] Filed: Nov. 6, 1975

[51] Int. Cl.² ........................................... G01R 15/08
[52] U.S. Cl. ................................................. 324/116
[58] Field of Search ................... 324/116, 137, 117 R, 324/113, 115

[56] References Cited
U.S. PATENT DOCUMENTS

| 2,037,447 | 4/1936 | Wenk | 324/116 |
| 3,127,594 | 3/1964 | Roe et al. | 324/137 |
| 3,380,064 | 4/1968 | Norris et al. | 324/113 |
| 3,689,836 | 9/1972 | Snyder | 324/117 R |

Primary Examiner—Rudolph V. Rolinec
Assistant Examiner—Ernest F. Karlsen
Attorney, Agent, or Firm—D. R. Lackey

[57] ABSTRACT

A multiple rate meter for totalizing electrical power usage from an alternating current supply, including a rotatable member which rotates at a speed proportional to the rate of power usage, and solid state circuitry which times the speed of the rotatable member versus the supply frequency. The electrical power usage is totalized in a first manner when the speed of the rotatable member is below a predetermined magnitude, and in a second manner when the speed reaches the predetermined magnitude.

13 Claims, 7 Drawing Figures

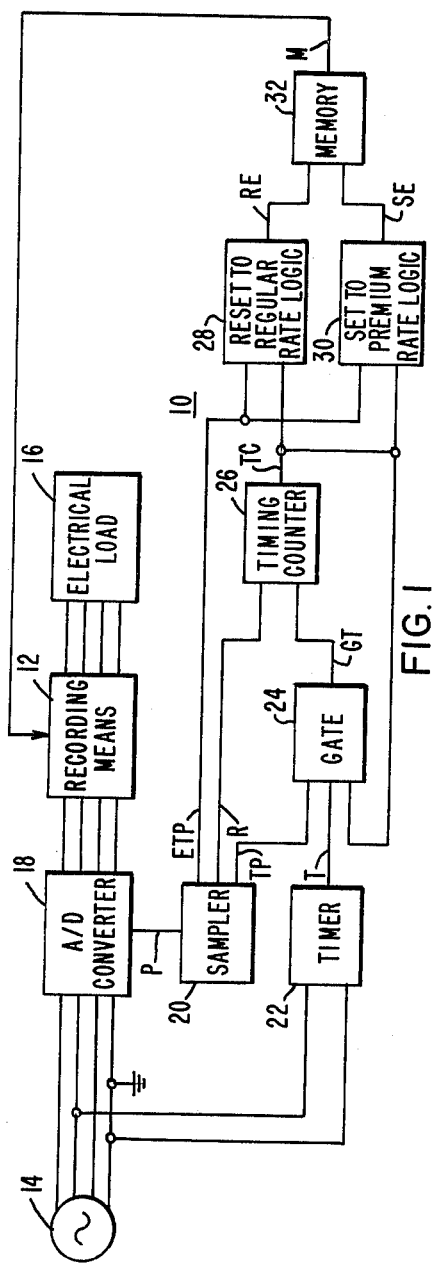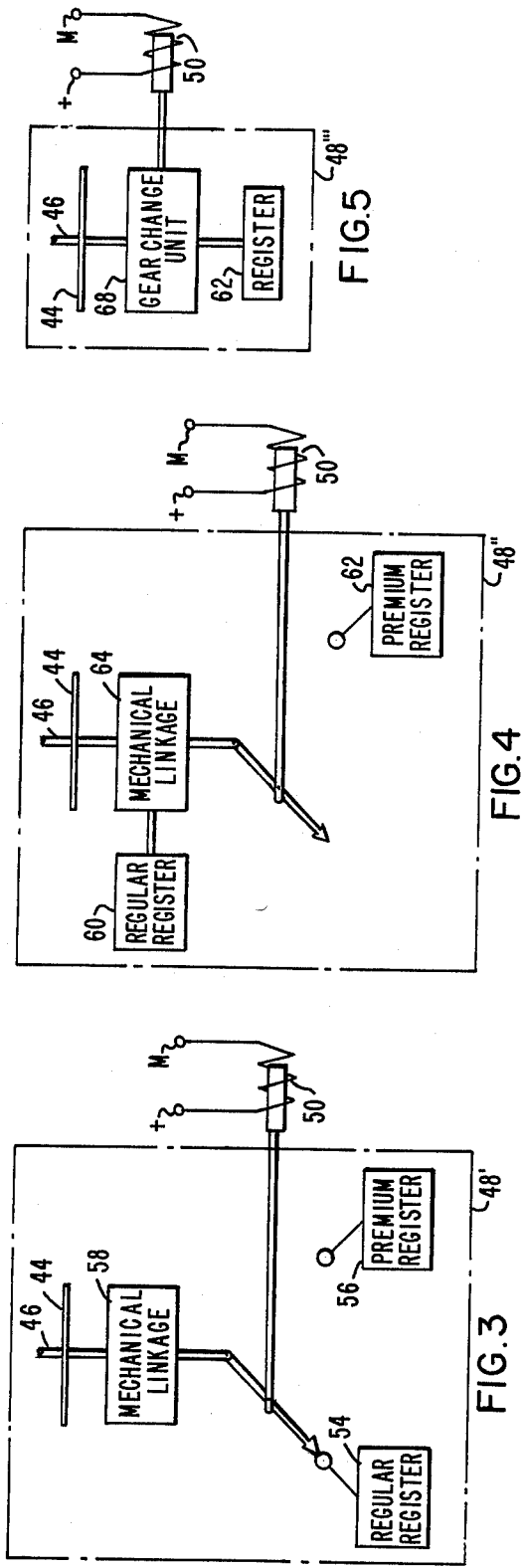

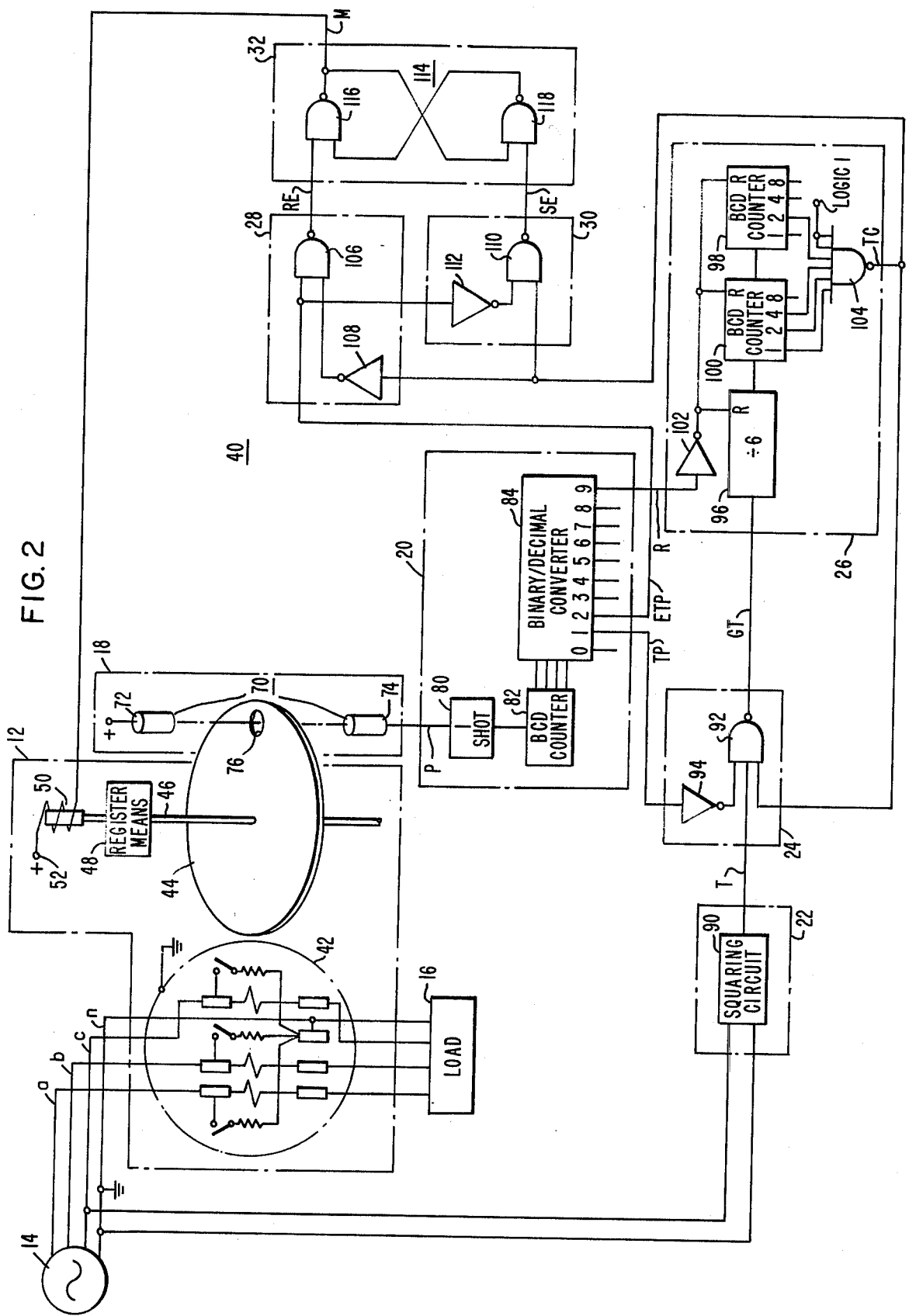

MULTIPLE RATE METER

BACKGROUND OF THE INVENTION

1. Field of the Invention

The invention relates in general to meter apparatus for measuring and totalizing electrical energy usage, and more specifically to multiple rate metering apparatus.

2. Description of the Prior Art

Multiple rate meters have been used in the prior art to enable an electric utility company to charge a customer different rates, based upon predetermined parameters, such as the amount of electrical energy used while the load is below a predetermined K.W. level, and the amount used while the load is at or above this K.W. level. For example, U.S. Pat. No. 1,142,425 discloses a meter having two registers, one which records the energy to be billed at a first rate, and one which records the energy to be billed at a higher rate. A spring on a relay is adjustably tensioned to cause the relay to operate at a selected load and cause a gear member engaged with the driving worm of a rotatable meter shaft to engage the gear of the desired register.

U.S. Pat. No. 1,957,010 discloses a meter having a single register with one of two gears being selected remotely when a tariff change is desired. The two gears drive the register at different speeds for a predetermined input speed.

U.S. Pat. No. 2,037,447 discloses a meter having two registers, with bimetal strips or springs, which are heated by load current, or a current proportional to load current, being operative to shift the worm gear on the meter disc shaft from driving one register to driving the other register.

U.S. Pat. No. 2,130,201 discloses a meter having first and second registers, which shifts from the first register to the second register after a predetermined amount of electrical energy is recorded on the first register during a predetermined time interval. The energy used during the remaining portion of the time interval is recorded on the second register.

Still other multiple rate meters register total K.W. hour usage on one register, and K.W. hour usage above an established demand level on a second register. One such system employs a synchronous motor driving differential gearing in an arrangement which totals K.W. hour usage on the second register when the differential is driven by the meter at a speed above the chosen K.W. level.

The multiple rate meters of the prior art which switch registers, or change the driving speed of a single register through a gear change, or which record total K.W. hour usage on one register and selectively activate a second register responsive to the level of power usage, all have one or more of the following disadvantages. They are mechanically complex and require periodic maintenance to insure dependable, accurate switching at the desired K.W. level, and/or the demand level at which the desired switching action occurs is difficult to change by the electrical utility user, i.e., it may be set by the original gearing, as in the case of the differential gearing apparatus hereinbefore described.

It would be desirable to provide a new and improved multiple rate meter which is mechanically simple, requiring little or no maintenance, which may be easily set to the desired K.W. level, and just as easily changed to a different K.W. demand level by the electrical utility, if desired.

SUMMARY OF THE INVENTION

Briefly, the present invention is a new and improved multiple rate meter which electrically establishes the K.W. load "set point" via solid state circuitry which requires little or no maintenance, and which provides a signal for operating a small electrical solenoid operatively connected to change registers, add a register, or change the gear ratios in the drive train of a single register. Further, the K.W. set point is selected by electrical connections between the output of a counter and a gate, which connections may be readily made to select the desired K.W. setpoint level, and just as easily change to select a different K.W. level, if desired.

In a preferred embodiment of the invention, the solid state circuitry times the disc speed of a watthour meter versus the supply frequency, making it unnecessary to provide an oscillator or clock which would be subject to errors over its operating life. The solid state circuitry is completely digital, eliminating potentiometers and other devices commonly used in analog circuits which are subject to drift and other errors due to temperature and age.

BRIEF DESCRIPTION OF THE DRAWING

The invention may be better understood, and further advantages and uses thereof more readily apparent, when considered in view of the following detail description of exemplary embodiments, taken with the accompanying drawings in which:

FIG. 1 is a functional block diagram of a multiple rate meter constructed according to the teachings of the invention;

FIG. 2 is a schemtic diagram of a multiple rate meter constructed according to a preferred embodiment of the invention;

FIGS. 3, 4 and 5 diagrammatically illlustrate different register arrangements which may be used with the multiple rate meter shown in FIG. 2.

DESCRIPTION OF THE PREFERRED EMBODIMENTS

Figure 6:
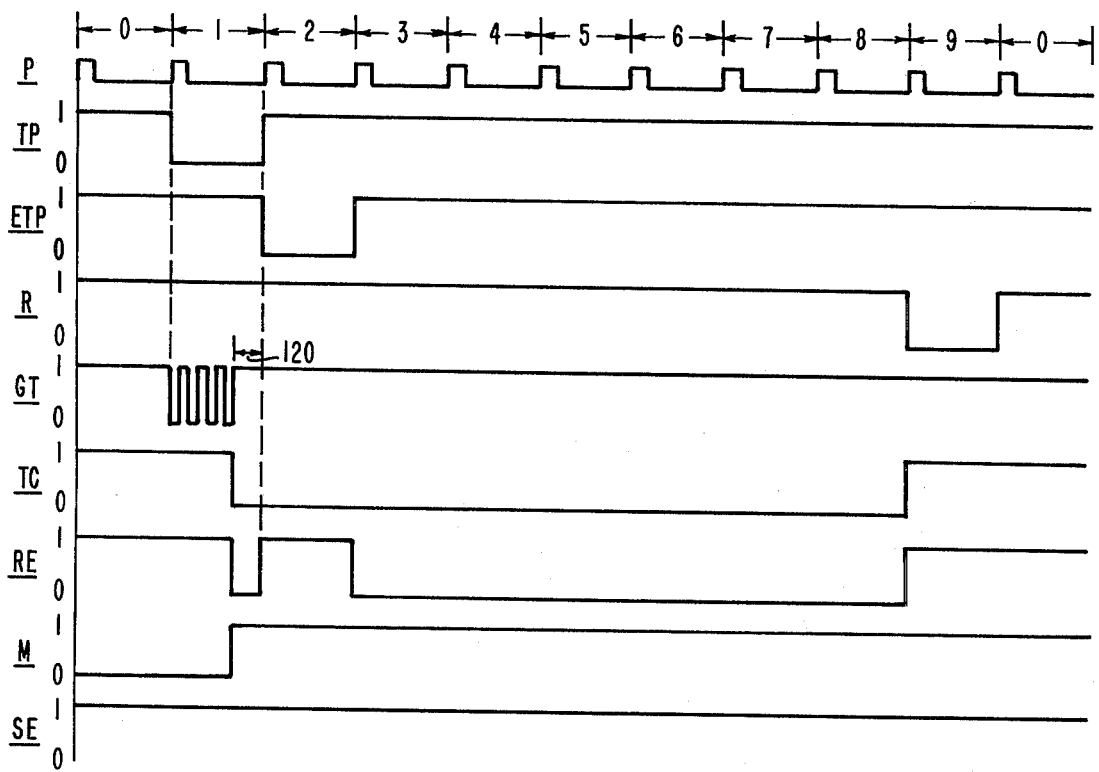
FIGS. 6 and 7 are graphs illustrating waveforms which will aid in understanding the operation of the multiple rate meter shown in FIG. 2.

Referring now the drawings, and FIG. 1 in particular, there is shown a functional block diagram of a multiple rate meter system 10 constructed according to the teachings of the invention. Meter system 10 includes totalizing recording or means 12 connected between a source 14 of alternating potential and an electrical load circuit 16. The totalizing means 12 records the electrical energy or Kilowatthour (K.W.H.) usage of the load 16 in a first predetermined manner while the electrical power or Kilowatts (K.W.) usage is below a predetermined magnitude, and in a second predetermined manner when the K.W. usage is at, or above the predetermined magnitude.

The means for determining whether or not the K.W. level is below or above the predetermined magnitude includes means for providing pulses spaced in time proportional to the level of K.W. usage. In FIG. 1 this means is indicated generally by analog to digital converter 18 which provides spaced pulses P responsive to the rate of electrical energy usage. In order to reduce the number of operations of the recording means between its first and second different modes of recording power usage when the power usage is fluctuating below and above the selected K.W. magnitude, sampling means 20 is provided to select predetermined pulses from a predetermined group of the pulses P for use by the solid state timing and logical comparison circuits to be hereinafter described. Sampler 20 provides a signal TP which is responsive to a first predetermined pulse P from converter 18, and a signal ETP which is responsive to a second predetermined pulse P. Signal TP signifies the beginning of a period of power usage to be timed, and signal ETP signifies the end of this period of power usage. Signals TP and ETP may be responsive to consecutive pulses P, or to two pulses P separated by a predetermined number of pulses P. Signal TP, once initiated, persists until signal ETP is generated. Sampler 20 also provides a signal R in response to that pulse P which signifies the end of the predetermined grouping of pulses, and thus signal R may be used as a reset signal to initialize the system for the next pulse grouping.

Thus, both the A/D converter 18 and sampler 20 provide pulses and signals, respectively, which are spaced in time proportional to the rate of electrical energy usage by the load 16, with the sampler 20 being used in the preferred embodiment of the invention to determine the kilowatt level during a predetermined portion of each predetermined block of electrical power used. For example, the sampler 20 may provide signals which enable the time to be measured for the load circuit 16 to use 100 K.W.H. out of every 1,000 K.W.H. consumed, and this 100 K.W.H. may be the first 100 K.W.H. of the 1,000 K.W.H., or any other selected usage of 100 consecutive K.W.H. during the usage of the 1,000 K.W.H.

Means for initiating a predetermined timed period in response to the signal TP includes a timer 22 which provides time pulses T at a uniform rate, with the rate being responsive to the frequency of the supply 14. The slaving of timer pulses T to the supply frequency eliminates the need for a separate oscillator or clock, and it also eliminates the errors which could occur should the separate oscillator or clock drift.

The timer 22 provides the timing pulses T continuously to a gate 24 which is enabled by a true signal TP. When signal TP goes true to start the timing period, the gate 24 passes the uniformly spaced time pulses T, with the gates pulses being referenced GT in FIG. 1.

The gated pulses GT are counted in a counter 26, referred to as a timing counter in FIG. 1, which timing counter provides a true signal TC when a predetermined selected count is reached. Signal TC thus goes true a predetermined period of time following the initiation of signal TP by sampler 20. The count of timing counter 26 which produces the true signal TC determines the K.W. level at which the totalizing means 12 should change modes. If the subsequent signal ETP is produced before the end of the timing period, i.e., before signal TC goes true, the power usage is above the selected K.W. level, and if the signal TC goes true before the subsequent signal ETP is generated, the power usage is below the selected K.W. level. The selected K.W. level is thus simply a matter of selecting the count of counter 26 which will provide the true signal TC, such as by connecting predetermined outputs of a binary counter to a gate which changes its output level when all inputs are true. The utility user may thus easily select the K.W. level, and just as easily change the selection.

The determination of which of the two signals, the subsequent signal ETP or the timing signal TC, is generated first, is made in reset and set logic 28 and 30, respectively. If the timing signal TC goes true, reset logic 28 provides a true signal RE which indicates the KW usage is below the selected K.W. level, and the recording means 12 should record the power usage such that the user pays the regular rate. If the signal ETP is provided before signal TC goes true, the set logic 30 provides a true signal SE which indicates the K.W. usage is above the selected K.W. level and the totalizing means 12 should record the power usage such that the user pays the premium rate. Signals RE and SE are applied to a memory 32 which has an output M switched to high and low states by the true RE and SE signals, respectively. The level of the signal M controls the recording or totalizing mode of the recording means 12.

FIG. 2 is a schematic diagram of a multiple rate meter system 40 constructed according to a preferred embodiment of invention. Meter system 40 is functionally the same as the meter system 10 shown in FIG. 1, with the reference numerals identifying the various functions in FIG. 1 also being used to identify similar functions in FIG. 2.

More specifically, when the source 14 is a three-phase, four wire source of alternating potential, the recording means 12 may be a multi-element induction device such as a three-element polyphase watthour meter 42, which elements operate on a common electroconductive disc armature 44. The disc armature 44 is mounted on a shaft 46 for rotation about the longitudinal axis of the shaft. The shaft 46 has a worm gear formed thereon which is in meshing engagement with a worm wheel to drive register means 48. U.S. Pat. No. 3,688,192, which is assigned to the same assignee as the present application, describes in detail a watthour meter which may be used to drive the disc armature 44.

The register means 48 may be of any suitable type which may be switched between first and second different recording modes such as separately recording kilowatthour energy used during different times. In the embodiment of FIG. 2, a small electrical solenoid 50 which has one end of its electromagnetic coil connected to a source of unidirectional potential, indicated by terminal 52, and its other end connected to the output of memory 32, is mechanically linked to the register means 48. When signal M is high, solenoid 50 is de-energized, and when signal M is low, solenoid 50 is energized.

FIGS. 3, 4 and 5 diagrammatically illustrate different register arrangements which may be used for the register means 48. FIG. 3 illustrates a register arrangement 48' which includes a regular rate register 54, a premium rate register 56, and a mechanical linkage 58 operable by solenoid 50 to link the shaft 46 to the regular rate register when the solenoid 50 is de-energized, and to link the shaft 46 with the premium rate register 56 when the solenoid 50 is energized.

FIG. 4 illustrates a register arrangement 48" having a regular rate register 60, a premium rate register 62, and a mechanical linkage 64. In this arrangement, the mechanical linkage 64 continuously engages the shaft 46 with the regular rate register, and the solenoid 50 actuates the mechanical linkage 64 to engage the premium rate register when the solenoid is energized, and to otherwise disengage the premium rate register 62.

FIG. 5 illustrates a register arrangement 48'" having a single register 66 and a gear change unit 68 linked to the solenoid 50. When the solenoid 50 is de-energized, the gear change unit 68 links the shaft 46 to register 66 with a gear linkage whch drives the register at the regular rate, and when solenoid 50 is energized the gear change unit 68 links shaft 46 to register 66 with a gear linkage which drives the register 66 at the premium rate, i.e., faster than the regular rate for the same level of power usage.

Returning now to FIG. 2, the A/D converter 18 may include a photo-electric pickup assembly 70 which includes a light emitting diode 72 and a photocell 74. The pickup assembly 70 is mounted relative to the disc armature 44 such that the radiometric radiation from the light emitting diode 72 passes through the anti-creep hole 76 disposed in the disc armature 44 and strikes the photocell, causing the photocell to conduct and provide a pulse P each time the disc armature rotates 360° corresponding to a predetermined quantity of electrical energy. Other detector-pulse arrangements may be used which will provide a pulse for each predetermined angular rotation of shaft 46.

The pulse P is applied to a sampler 20, where it may be shaped into a square pulse configuration by a suitable shaping circuit, such as a monostable multivibrator 80 (one-shot). The monostable multivibrator may be RCA's CD 4047A, connected in the monostable mode, for example. A Schmitt trigger squaring circuit may also be used, such as one of the Schmitt triggers in RCA's CD 4093B.

The shaped pulses from the monostable multivibrator 80 are applied to an arrangement which includes a plurality of output terminals which are normally low, or normally high, and which go to the opposite state on a different pulse P from each predetermined grouping of P pulses. For example, this arrangement may include a BCD counter 82 and a binary to decimal converter or decoder 84, such as Texas Instruments' SN 7490 and SN 7442, respectively. Decoder 84 sequentially drives its outputs low as the counter 82 advances through its counts. This arrangement will divide the pulses P into groups of ten, and thus, for example, one revolution of the disc armature 44 may be timed out of every 10 revolutions or each quantity of electrical energy which is one tenth of a larger predetermined energy quantity is quantized. A 5-stage Johnson decade counter and an output decoder which converts the Johnson binary code to a decimal number, such as RCA's CD 4017A, may be used instead of counter 82 and converter 84, or any other suitable arrangement may be used which sequentially drives one of a plurality of outputs high, or low, responsive to the input pulses P. The output of RCA's CD 4017A are sequentially driven high, instead of low, as described for decoder 84.

In the example of FIG. 2, the signal TP which starts the timing period is produced by the "1" output of decoder 84, and signal TP is thus low while the output of counter 82 is 0001. The signal ETP which is produced when a predetermined amount of electrical energy has been used, is provided by the "2" output of the decoder 84. The reset signal R is provided by the "9" output of decoder 84.

The timer 22 may simply be a squaring circuit 90 connected to the source 14 to provide squarewave timing pulses T at the rate of 60 pulses per second. The squaring circuit 90 may be a Schmitt trigger squaring circuit, such as one of the Schmitt triggers in RCA's CD 4093B.

The gate 24 may include a three input NAND gate 92 and an inverter gate 94. A 3-input NAND gate may be one of the NAND gates in RCA's CD 4023A, and inverter gate 94, as well as the other inverter gates, may be provided by RCA's hex inverter CD 4069B. The low true signal TP is connected to one input of NAND gate 92 via the inverter 94, the timing pulses T are connected to another input of NAND gate 92, and signal TC from the timing counter 26 is connected to the remaining input of NAND gate 92. Thus, when signal TP goes low inverter 94 applies a logical one to NAND gate 92. NAND gate 92 thus provides pulses GT responsive to timing pulses T when signal TP is true, and it continues to provide pulses GT until the end of signal TP, or until signal TC goes low (true), whichever occurs first.

The timing counter 26 may include a scaler, such as a divide by 6 counter 96, first and second BCD counters 98 and 100, respectively, an inverter gate 102, and a six input NAND gate 104. The divider 96 may be Texas Instruments' SN 7492, for example, and the BCD counters 98 and 100 may each be Texas Instruments' SN 7490, for example. In CMOS, the divider 96 may be RCA's CD 4018A programmed to divide by six, and counters 98 and 100 may be RCA's dual BCD counter CD 4518B.

The output signal R from sampler 20 is connected to the reset inputs of the divider 96 and counters 98 and 100 via inverter 102. The pulses GT are applied to the divider counter 96 and the divider 96 applies 10 pulses per second to the BCD counters 98 and 100. Counters 98 and 100 form the "units" and "tens" of a count which can go to 99 and thus time a period up to 9.9 seconds before resetting. Any period time of 9.9 seconds, or less, may be selected to drive the output of NAND gate 104 low, and provide a true signal TC terminating the time period. For purposes of example, it will be assumed that the induction device 42 is the watthour meter described in the hereinbefore mentioned patent used on a 120/208 volt, four wire Y service with 400/5 ampere current transformers. At test amperes ($T_a$ = 2.5 amperes) or 900 watts, the disc armature 44 will make one revolution in 7.2 seconds in response to the electric energy passing through the meter. Power on the primary side of the current transformers would be 900 x (400/5) or 72 K.W. If it is desired to make 72 K.W. the load transfer point, for example, output "2" of the low order counter 98 would be connected to an input of NAND gate 104, output "1", "2", and "4" of the high order counter 100 would be connected to inputs of the NAND gate 104, and the unused inputs of NAND gate 104 are tied to a logical one source. Thus, when counters 98 and 100 reach a count of 72 in response to the 10 pulse per second output of divider 96, the output of NAND gate 104 will provide a low true signal TC. NAND gate 104 may be RCA's CD 4068B.

The reset logic 28 includes a NAND gate 106 and an inverter gate 108, and the set logic 30 includes a NAND gate 110 and an inverter gate 112. Signal ETP is applied directly to an input of NAND gate 106 and to an input of NAND gate 110 via inverter 112. Signal TC is applied directly to NAND gate 110 and to an input of NAND gate 106 via inverter 108.

The output signals RE and SE of the reset and set logic circuits 28 and 30, respectively, are applied to inputs of memory 32. Memory 32 may be an R-S flipflop 114 formed of cross-coupled NAND gates 116 and 118. The 2-input NAND gates 116 and 118, as well as NAND gates 106 and 110, may be provided by RCA's QUAD 2-input NAND CD 4011A. Signal RE is applied to an input of NAND gate 116, signal SE is applied to an input of NAND gate 118, and the output of NAND gate 116 provides the signal M which is applied to one terminal of the electromagnetic coil of solenoid 50. If CMOS logic is used, a buffer would be added between output M and solenoid 50.

Figure 7:
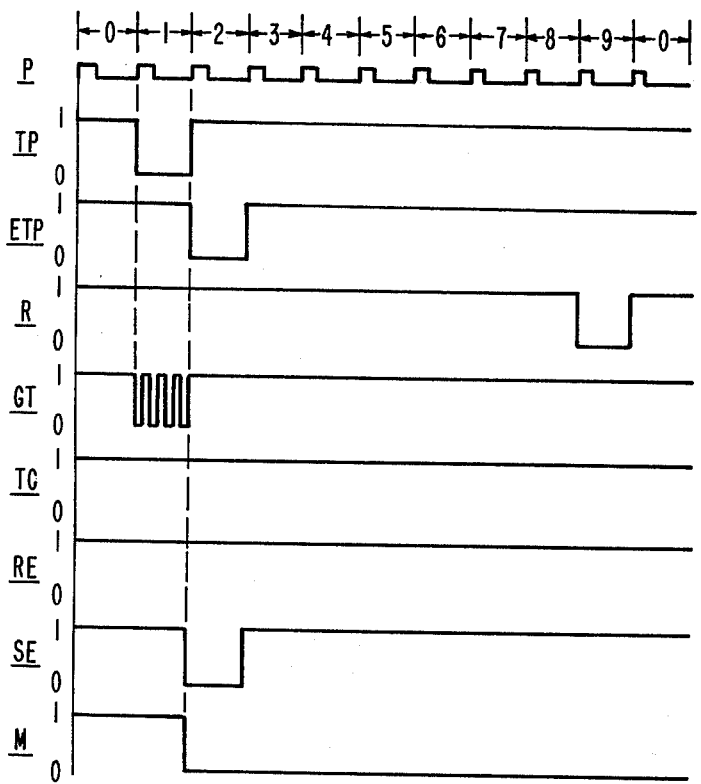

In the operation of the multirate meter system 40 shown in FIG. 2, an example in which the power usage is below 72 K.W. will first be described, and then an example in which the power usage exceeds 72 K.W. will be described. FIGS. 6 and 7 are graphs of waveforms which are explanatory of these two examples, and these figures will be referred to during the description of the circuit operation.

Each pulse P provided by photocell 74 advances counter 82 one stage. When counter 82 is reset, the "0" output of decoder 84 is low and the remaining outputs are high. On the first pulse P, counter 82 is advanced to count 0001 and the "1" output of decoder 84 goes low to provide a low true signal TP. The low signal TP is inverted to a logical one by inverter 94 and NAND gate 92 provides timing pulses GT. Divider 96 divides the GT pulses by 6 and counters 98 and 100 count the pulses provided by divider 96. In the first example, the power usage is below the selected 72 K.W. level, and the counters 98 and 100 will thus reach the count of 72 during the low true signal TP. NAND gate 104 is thus driven low on count 72 to provide the low true TC signal which blocks NAND gate 92 from passing any additional timing pulses from squaring circuit 90. As illustrated at 120 in FIG. 6, the pulses GT are terminated before the end of signal TP. Signal ETP is still high when signal TC goes low, and the low signal TC is inverted to a logical one by inverter 108. The output of NAND gate 106 of the reset logic 28 is thus driven low which causes NAND gate 116 to provide a logical one output. Signal M, which is connected to solenoid 50, is thus a logical one which causes the solenoid to drop out, if signal M was previously a logical zero, to set the register means 48 for the regular rate. If signal M was already a logical one, of course, the memory 32 would already be reset to indicate the regular rate and the solenoid 50 would already be de-energized. When signal R goes low, it resets the timing counter 26 to prepare for the next measurement period.

If the power usage should now increase above the 72 K.W. level, illustrated graphically in FIG. 7, the low true signal TP will start the timing counter 26 as before, but before counters 98 and 100 reach the count of 72, signal TP ends to block gate 92 and signal ETP goes low. Signal TC is high and the low signal ETP is inverted to a logical one by inverter 112 to drive the output of NAND gate 110 low and set the flip-flop 114 to provide a low output signal M which energizes solenoid 50 and sets the register means 48 to the premium rate mode. If the K.W. level is still above 72 K.W. during the next measurement period, flip-flop 114 merely remains set, and will not be reset until the power usage drops below 72 K.W.

If the user utility wishes to change the K.W. level which determines the premium rate, it is only necessary to change the electrical connections between the BCD counters 98 and 100 and the gate 104.

In summary, there has been disclosed a new and improved multiple rate meter which selects the kilowatt setpoint level with solid state static circuitry which may be easily set to the desired level, and just as easily changed to a different K.W. level. The solid state circuitry requires little or no maintenance, and it is completely digital, making it immune to errors due to temperature and age. In a preferred embodiment of the invention, the disc speed of a watthour meter is timed versus the supply frequency, eliminating the need for a separate clock or oscillator which would be subject to drift or error over the operating life of the meter. The sampling of one meter disc revolution out of 10 is an arbitrary choice aimed at limiting the number of operations of the solenoid and "premium rate" register engagements. With little change, sampling could be more or less frequent, or more than one disc revolution could be timed as a sample.

To expand the utility of the multiple rate meter, a set of contacts could be simultaneously closed by the register solenoid. For special load studies or rates, these contacts could control an "elapsed time" counter or, it could be arranged for use by the consumer to give an indication that high load is being metered at the premium rate.

We claim as our invention:

1. a multiple rate meter system for totalizing electrical power usage of electrical energy supplied to a load, comprising:
   first means producing pulses spaced in time proportional to the rate of usage of the electrical energy, wherein each pulse represents a prededetermined quantity of electrical energy and successively reoccurring groups of identical numbers of said pulses each represent a corresponding larger quantity of electrical energy,
   second means initiating time signals defining a predetermined timing period in response to a first pulse of each of the pulse groups produced by said first means, said predetermined timing period corresponding to a predetermined value of kilowatt power usage directly related to the time intervals of said pulses,
   and third means responsive to said first pulse of said first means and said time signals of said second means, said third means including totalizing means for totalizing the power usage in a first predetermined manner when the time between said first pulse and a predetermined subsequent pulse in each of the pulse groups produced by said first means exceeds said predetermined timing period, and totalizing in a second predetermined manner when the time between the first and subsequent pulses does not exceed said predetermined timing period.

2. The meter system of claim 1 wherein the first means includes means applying a first signal to the second means in response to the first pulse, and applying a second signal to the third means in response to the subsequent pulse, and the second means includes means applying a third signal to the third means at the end of the timing period, at least when the timing period expires before the second signal is applied by the first means, with the totalizing means totalizing the power usage in the first predetermined manner when the third signal is received by the third means before the second signal, and in the second predetermined manner when the third signal is not received before the second signal.

3. The meter system of claim 1 wherein the second means includes means for selectively changing the magnitude of the predetermined timing period to a correspondingly related value of kilowatt power usage.

4. The meter system of claim 2 wherein the second means includes electrical means for changing the magnitude of the predetermined timing period to a correspondingly related value of kilowatt power usage.

5. The meter system of claim 1 wherein the first pulse and the subsequent pulse are consecutive pulses in each of the pulse groups.

6. The meter system of claim 2 wherein the first means includes counting means for counting the pulses which are proportional to the rate of electrical energy usage, with said counting means having predetermined different counts producing said first and second signals to the second and third means indicative of the first pulse and the subsequent pulse, respectively.

7. The meter system of claim 6 wherein a predetermined count of the counting means provides a signal in response to a last pulse of each of the pulse groups which resets the second means for initiating each predetermined timing period.

8. The meter system of claim 1 wherein the first means includes a watthour meter having rotatable member which rotates at a rate proportional to the rate of electrical energy usage, and pulse means responsive to said rotatable member so as to produce a pulse for each predetermined angular movement thereof.

9. The meter system of claim 8 wherein the first means includes a binary counter which counts the pulses and a binary to decimal converter responsive to the count of said binary counter, with predetermined outputs of the binary to decimal converter producing first and second signals to the second and third means responsive to the first pulse and the subsequent pulse, respectively, of each of the pulse groups.

10. The meter system of claim 1 wherein the first means includes means producing first and second signals to the third means responsive to the first pulse and subsequent pulse, respectively, and wherein the second means includes means providing timing pulses at a predetermined uniform rate, counter means for counting the timing pulses in response to the first signal being produced by the first means, and gate means responsive to the counter means, said gate means producing a signal to the third means when the counter means reaches a predetermined count, at least when the predetermined count is reached prior to the generation of the subsequent pulse.

11. The meter system of claim 1 wherein the second means produces a termination signal to the third means at the end of the timing period, at least when the timing periods ends prior to the generation of the subsequent pulse, and wherein the third means includes logic means and memory means, said logic means setting said memory means to a first condition when the termination signal is received by the third means prior to the generation of the subsequent pulse, and setting said memory means to a second condition when the subsequent pulse is initiated before the end of the timing period, with the totalizing means being responsive to the first and second conditions of said memory means to effect the first and second predetermined manners of recording.

12. A multiple rate meter system for totalizing electrical energy usage from source of alternating current electrical power, comprising:
    a meter device including a rotatable member which rotates at a rate proportional to the rate of electrical energy usage,
    timer means producing timing pulses controlled by the frequency of the alternating current electrical power,
    pulse generating means producing meter pulses responsive to a predetermined angle of rotation of said rotatable means,
    pulse counter means responsive to said timing pulses for producing initial and terminating timing signals establishing a predetermined timing period corresponding to a predetermined number of said timing pulses occurring during a predetermined angle of rotation of said rotatable member at a given value of kilowatt power usage of the alternating current electrical power, said pulse counter means being responsive to each pulse produced by one of a plurality of predetermined angles of rotation to periodically produce said initial timing signals,
    logic circuit means responsive to said meter pulses and said terminating timing signals to establish either of two logic states; and
    totalizing means controlled by the logic states of said logic circuit means for totalizing the power usage in a first predetermined manner when said predetermined timing period expires before the rotatable member rotates through said predetermined angle to establish one of the logic states, and totalizing in a second predetermined manner when the rotatable member rotates through said predetermined angle before the end of said predetermined timing period to establish an opposite logic state.

13. The meter system of claim 12 wherein the predetermined timing period is adjustable.

* * * * *